(12) United States Patent
Zimmerman et al.

(10) Patent No.: US 9,816,201 B2
(45) Date of Patent: *Nov. 14, 2017

(54) USE OF FREESTANDING NITRIDE VENEERS IN SEMICONDUCTOR DEVICES

(71) Applicants: Scott M. Zimmerman, Basking Ridge, NJ (US); William R. Livesay, San Diego, CA (US); Richard L. Ross, Del Mar, CA (US)

(72) Inventors: Scott M. Zimmerman, Basking Ridge, NJ (US); William R. Livesay, San Diego, CA (US); Richard L. Ross, Del Mar, CA (US)

(73) Assignee: Goldeneye, Inc., San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/814,440

(22) Filed: Jul. 30, 2015

(65) Prior Publication Data

US 2015/0329988 A1    Nov. 19, 2015

Related U.S. Application Data

(63) Continuation of application No. 13/555,082, filed on Jul. 21, 2012, now abandoned.

(Continued)

(51) Int. Cl.
*C30B 25/18* (2006.01)
*C30B 25/10* (2006.01)
(Continued)

(52) U.S. Cl.
CPC ............ *C30B 25/186* (2013.01); *C30B 19/12* (2013.01); *C30B 23/025* (2013.01); *C30B 23/08* (2013.01); *C30B 25/02* (2013.01); *C30B 25/06* (2013.01); *C30B 25/105* (2013.01); *C30B 29/06* (2013.01); *C30B 29/08* (2013.01); *C30B 29/16* (2013.01); *C30B 29/40* (2013.01); *C30B 29/403* (2013.01); *C30B 29/406* (2013.01); *C30B 29/42* (2013.01); *C30B 29/52* (2013.01); *H01L 31/028* (2013.01); *H01L 31/0296* (2013.01); *H01L 31/0304* (2013.01); *H01L 31/036* (2013.01); *H01L 31/03044* (2013.01); *H01L 31/0547* (2014.12); *H01L 31/0687* (2013.01); *H01L 31/0693* (2013.01); *H01L 31/074* (2013.01); *H01L 31/0725* (2013.01); *H01L 31/0735* (2013.01);
(Continued)

(58) Field of Classification Search
CPC .................................................. C30B 29/406
See application file for complete search history.

(56) References Cited

U.S. PATENT DOCUMENTS 6,447,604 B1    9/2002    Flynn et al.
2002/0117675 A1    8/2002    Mascarenhas
(Continued)

OTHER PUBLICATIONS

Dr. Alan Doolittle, Lecture 6 Rapid Thermal Processing, Sep. 23, 2008, pp. 1 to 11, Georgia Institute of Technology, School of Electrical and Computer Engineering, ECE 6450 Class.

*Primary Examiner* — Stephen M Johnson
(74) *Attorney, Agent, or Firm* — William Propp, Esq.

(57) ABSTRACT

Thin freestanding nitride veneers can be used for the fabrication of semiconductor devices. These veneers are typically less than 100 microns thick. The use of thin veneers also eliminates the need for subsequent wafer thinning for improved thermal performance and 3D packaging.

6 Claims, 20 Drawing Sheets

Related U.S. Application Data

(60) Provisional application No. 61/572,770, filed on Jul. 21, 2011.

(51) Int. Cl.

| | | |
|---|---|---|
| *C30B 25/06* | (2006.01) | |
| *C30B 23/08* | (2006.01) | |
| *C30B 23/02* | (2006.01) | |
| *C30B 19/12* | (2006.01) | |
| *C30B 29/06* | (2006.01) | |
| *C30B 29/08* | (2006.01) | |
| *C30B 29/52* | (2006.01) | |
| *C30B 29/42* | (2006.01) | |
| *C30B 29/40* | (2006.01) | |
| *C30B 29/16* | (2006.01) | |
| *H01L 31/0304* | (2006.01) | |
| *H01L 31/028* | (2006.01) | |
| *H01L 31/0296* | (2006.01) | |
| *H01L 31/036* | (2006.01) | |
| *H01L 31/0693* | (2012.01) | |
| *H01L 31/0687* | (2012.01) | |
| *H01L 31/0735* | (2012.01) | |
| *H01L 31/074* | (2012.01) | |
| *H01L 31/18* | (2006.01) | |
| *H01L 33/00* | (2010.01) | |
| *H01L 31/0725* | (2012.01) | |
| *C30B 25/02* | (2006.01) | |
| *H01L 31/054* | (2014.01) | |

(52) U.S. Cl.
CPC ............ *H01L 31/18* (2013.01); *H01L 31/184* (2013.01); *H01L 31/1804* (2013.01); *H01L 31/1808* (2013.01); *H01L 31/1812* (2013.01); *H01L 31/1844* (2013.01); *H01L 31/1848* (2013.01); *H01L 31/1856* (2013.01); *H01L 31/1892* (2013.01); *H01L 33/0054* (2013.01); *H01L 33/0062* (2013.01); *H01L 33/0075* (2013.01); *H01L 33/0083* (2013.01); *Y02E 10/52* (2013.01); *Y02E 10/544* (2013.01); *Y02E 10/547* (2013.01); *Y02P 70/521* (2015.11); *Y10T 428/31678* (2015.04)

(56) References Cited

U.S. PATENT DOCUMENTS

| | | |
|---|---|---|
| 2005/0167697 A1 | 8/2005 | Flynn et al. |
| 2009/0140279 A1 | 6/2009 | Zimmerman |
| 2009/0218589 A1* | 9/2009 | Zimmerman ....... H01L 29/1608 257/99 |
| 2010/0032682 A1* | 2/2010 | Zimmerman ....... H01L 21/2007 257/76 |
| 2010/0060553 A1 | 3/2010 | Zimmerman |
| 2010/0307572 A1* | 12/2010 | Bedell ................ H01L 31/0725 136/255 |

\* cited by examiner

USE OF FREESTANDING NITRIDE VENEERS IN SEMICONDUCTOR DEVICES

REFERENCE TO PRIOR APPLICATION

This application is a continuation of prior U.S. patent application Ser. No. 13/555,082, filed on Jul. 21, 2012 and claims the benefit of U.S. Provisional Patent Application Ser. No. 61/572,770, which was filed on Jul. 21, 2011, both of which are herein incorporated by reference.

BACKGROUND OF THE INVENTION

Silicon semiconductor devices are typically manufactured in wafer form due to the availability of boule growth processes for silicon and other popular semiconductor devices. Nitrides however lack a suitable low cost native substrate. Even if such wafers were available polishing to an epi ready surface is problematic due to variable miscut angles, surface defects, and low etch rates. The difficulty in polishing especially high quality HVPE nitride surfaces is discussed by DenBaars in Chemical Mechanical Polishing of Gallium Nitride (2002). As such considerable efforts have gone into growing nitrides on non-native substrates such as sapphire, silicon, silicon carbide and glass. The quality of devices is always compromised when non-native substrates are used. Lattice mismatches between the non-native substrate and nitride layer induces internal stresses, limits subsequent process temperature ramp rates, and even decreases growth rates of subsequent layers. Device designs are also limited by the presence of a non-native substrate. This leads to additional processing steps such as transfer processes like laser liftoff or multiple etching steps to expose under-lying layers for interconnect and thermal performance reasons. In addition, polarization effects can play a significant role in device performance. The stresses created by the lattice mismatch between the non-native substrate and nitride layer have been shown to affect virtually every device performance parameter ranging from high current droop to indium incorporation. Lastly, the use of non-native substrates limits subsequent epitaxial growth processes due to a tendency for wafers to crack or shatter during the rapid thermal changes required for device growth. The need therefore exists for novel methods and devices which overcomes these limitations.

Thick (>5 mm) freestanding nitride wafers up to 2 inch in diameter have been grown in the prior art but are extremely expensive and typically have a large number of cracks and other defects. To obtain thin slices from this thick boule they must be mechanically sawed. The slicing process introduces defects due to misalignment to the crystal planes. In addition the polishing steps required to create an epitaxial surface introduces defects and requires several hours of polishing. The bulk nitride boule is also significantly bowed at room temperature. Cutting flat wafers from this growth causes a variable miscut across each wafer sliced from the boule. This causes the electrical or optical properties of devices grown on these nitride wafers to vary based on their location across the wafer. An example of diced wafers from boule growth can be seen in Dmitriev Pat. Appl. 20060280668. In Dmitriev AlN boules are grown greater than 5 mm thick and then diced and polished to create a wafer greater than 6 cm in diameter. Polishing defects and variable miscut angle defects are inherent to this prior art process. The need exists for a low cost freestanding substrate which does not require slicing or polishing and its inherent defects but has sufficient mechanical integrity for further processing and handling.

High pressure/High temperature growth methods for GaN boules suffer from the same cutting and polishing issues as HVPE based boules but also suffer from contamination issues as well which can negatively impact the absorption or alpha coefficient of the material. In general, high alpha leads to high optical absorption losses which further illustrates the need for an economical source of thin nitride growth substrates.

In many devices the need also exists for access to both the front and back of the nitride layer. Multi junction solar cells would especially benefit from the ability to grow/deposit semiconductor layers on both sides of a thin nitride low defect veneer. Used for optical device fabrication nitrides can span a significant portion of the visible spectrum. With high doping concentrations InN has been shown to exhibit a bandgap of 0.7 eV, however to achieve this high doping concentration very pure and very low defect Gallium Nitride is required. High quality high indium composition InGaN is difficult to grow. Typically this is done with expensive and tedious processes like molecular beam epitaxy (MBE). These processes cannot be scaled up to achieve a high throughput low cost means of production. Therefore a need exists for a low cost and viable process to produce low cost high quality nitrides which do not have to be sawed and polished and have low stress and low defect densities and can accept high doping concentrations dopants (e.g. Indium).

Another very prevalent problem of growing nitride layers on thick substrate templates is stress and warping induced by the difference in thermal expansion of the two layers. As an example a typical 30 micron GaN on thick (440 µm) sapphire 2 inch diameter template will bow over 200 microns either at room temperature or at growth temperature. If the bow is present at room temperature, formation of contacts and liftoff processes exhibit low yield due to the non-flat nature of the template. If the bow is present during growth processes, non-uniform heating is typically experienced which results in variation of device characteristics (e.g. greater than 100 nm of variation in peak wavelength output has been seen for 30 micron templates on sapphire). The stresses induced due to the mismatch of thermal expansion coefficients result in limitations on doping concentrations attainable. For example GaN layers under stress during doping will accept lower concentrations of dopants (e.g. Indium).

As detailed above nitride templates exhibit significant bow either at room temperature or growth temperature which reduce yield. These template approaches are also sensitive to rapid thermal transients which limit reactor processing conditions. For example nitride films on thick foreign substrates will crack if thermal cycled at too rapid of a rate. Bulk nitride approaches besides being cost prohibitive, exhibit surface defects due to polishing and have a variable miscut across the wafer which leads to variation in the device performance across the wafer. Therefore a need exists for an improved method of growing nitride layers that are stress free, can absorb dopants, are not sensitive to cracking during fast thermal cycling, can be uniformly heated and are economical to produce.

As discussed above, conventional nitride growth substrates in all forms suffer from significant internal stresses. As such a number of processing constraints are placed on the growth reactors used to make devices on these nitride growth substrates. The nitride veneers disclosed in this filing do not have the same processing constraints as the existing nitride growth substrates listed above. As such the need exists for a growth reactors which can take advantage of the improved processing conditions offered by nitride veneers.

SUMMARY OF THE INVENTION

Thin veneers of nitrides, devices formed on thin nitride veneers, methods of forming thin nitride veneers and methods of forming devices on thin nitride veneers are embodiments of this invention. The use of these veneers as subsequent growth substrates is disclosed. The use of flexing means to modify the stress profile in the veneer during or after subsequent processing steps is also disclosed. The use of this technique to enhance electron/hole overlap in quantum well structures is a preferred embodiment of this invention. The growth of a substantially different bandgap material on a nitride veneer is an embodiment of this invention. The use of a dilute nitride buffer layer between the nitride veneer and a substantially different bandgap material is an embodiment of this invention. The use of annealing process including but not limited to rapid thermal annealing and laser annealing prior to or after deposition of a substantially different bandgap material in a controlled atmosphere is also disclosed.

The ability to grow silicon, Si/Ge, and other low bandgap materials on nitride veneers is disclosed in this invention, as well as the use of these materials in multi-junction devices such as solar cells. Using this approach high quality nitride solar cells tuned to short wavelengths of the solar spectrum can be combined with efficient red and IR solar cells in a cost effective manner. The growth of low bandgap materials on nitride veneers is an embodiment of this invention. Using this approach, this invention enables the integration of a wide range of semiconductors using a thin nitride veneer as the growth substrate. The flexible nature of the freestanding nitride veneer allows for stress relief during and after growth. Unlike bulk thick nitride wafers, flexible veneers allow for compensation of crystal lattice mismatch. Unlike template or engineered substrates the nitride veneer layer disclosed is not restrained and can therefore flex as needed to compensate for mismatches between the layers. Direct epitaxial growth of layers with very large lattice mismatches have been demonstrated on freestanding nitride veneers.

The intent of this invention is to disclose the use of thin freestanding nitride veneers for the fabrication of semiconductor devices. These veneers are typically less than 100 microns thick. The use of thin veneers also eliminates the need for subsequent wafer thinning for improved thermal performance and 3D packaging. In vertical devices the series resistance and thermal resistance is directly proportional to the thickness of the device. Most preferred are veneers with a thickness between 20 microns and 100 microns. Even more preferred are nitride veneers with a thickness between 30 microns and 75 microns. The bulk thermal conductivity of GaN is between 120 and 200 W/m·K depending on crystal quality with an estimated theoretical maximum thermal conductivity of up to 400 W/m/K. A typical LED device can generate several watts of heat per mm2. A bulk wafer 300 microns thick has 6 times the thermal resistance of a 50 micron thick nitride veneer. As such, in bulk wafers thinning techniques are required to make useful devices. Nitride veneers eliminate the need for thinning and wafer bonding processes.

The veneers disclosed are flexible in nature and are substantially all nitride in composition. This then eliminates the requirement to use non-native substrates with all their attendant deficiencies. The substantially homogenous nature and low thermal mass of the freestanding nitride veneers allow for the use of epitaxial growth methods which exhibit rapid thermal temperature changes as required for devices including but not limited to quantum wells, solar cells, laser diodes, sensors, and electronic devices (HEMTs, FETs, etc.). This enables the use of rapid heating and cooling techniques within the reactor which in turn allows for much tighter controls of compositions within thin layers. The use of veneers in HYPE, MOCVD, MBE, ALD as well as other growth processes as known in the art is an embodiment of this invention. The use of these thin veneers as growth substrates for enhanced composition control of thin layers is a preferred embodiment of this invention.

The use of thin veneers offers several advantages over polished wafers and thick nitride templates grown on non-native substrates. In the case of polished wafers, the polishing process introduces a large number of defects into the substrate surface. The stress profiles within the polished wafers are also much higher than the thin veneers disclosed in this invention. Polished wafers are typically cut from 1 cm thick HVPE growth on sapphire or some other non-native substrate. This is very costly process and yields only a limited number of wafers per run. Unlike polished wafers, the veneers disclosed in this invention can exhibit at least one epi-ready surface which requires no further polishing steps before growth. As stated earlier, the stress within the veneer is much lower and can be adjusted by flexing the veneer during subsequent growth steps. In this manner, the spontaneous and induced polarization fields within the finished devices can be modified. With respect to thick nitride templates, veneers are freestanding and can go through very rapid temperature changes without cracking. This is especially critical in the formation of MQWs and other thin layered devices. In addition the flexible nature, high thermal conductivity, thinness of the freestanding nitride veneers allows for more uniform heating during subsequent device growth steps.

The veneers cited in this disclosure are harvested freestanding nitride layers from thick HVPE templates specifically engineered for the low alpha within the visible wavelength region. Typically the layers are between 20 and 150 microns thick and even more preferable between 30 and 100 microns thick. Undoped, n doped, semi-insulating, and p doped layers are disclosed. The doping may be uniform or graded through the layer. While polar C plane with less than 1 degree off cut is preferred, other crystal orientation including semi-polar and non-polar are disclosed. These layers are flexible and epi-ready as harvested using the patented laser liftoff approach referenced and part of this disclosure U.S. patent application Ser. Nos. 2009-0140279; 2010-0032682; and 2010-0060553, commonly assigned and herein incorporated by reference. These flexible freestanding foils are then used directly without any further processing steps to generate the devices disclosed in this filing.

Unlike GaAs, GaN can be handled in very thin layers. Even though dislocations densities are high, veneers of GaN between 20 and 150 micron which are flexible and crack free can be formed by a variety of methods including but not limited to laser liftoff, chemical etching, use of a mechanically weak interface, and photochemical means. While templates with reasonable thickness have been grown by several groups, not all growths are suitable for thin veneers. Stress profiles within the layer are very critical for the formation of robust thin veneers. 30 micron thick layers with a surface area greater than 1 inch square have been harvested. With the use of proper fixtures, these thin layers can be mounted for regrowth, coating, annealing, stacked, and printed on without damage. A key attribute of these thin veneers are that thinning techniques are not required to create thin die with enhanced optical, thermal, and electrical performance. An embodiment of this invention is a nitride veneer with thickness between 20 microns and 150 microns which can be handled freestanding with a surface area greater than 0.5 cm$^2$. More preferably a freestanding nitride layer with a thickness between 30 and 100 microns with a surface area greater than 1 cm$^2$ is disclosed. The shape of the freestanding nitride veneer can be used to determine the bow characteristics of the veneer and which stress plane is relaxed or stressed. What is apparent is that the surface stress of the veneer is reduced by the separation from the growth substrate as indicated by the bow. This unique feature of the veneers is believed to be the reason behind the observed improvements in subsequent growth crystal quality and higher indium incorporation. The anisotropic stress pattern in a square freestanding nitride layer with one edge parallel to the flat of a standard C plane sapphire wafer from which it was grown tends to create a uniaxial bow which can be used to help in mounting in a manner similar to a leaf spring. The use of this attribute to enable mounting in a reactor or other subsequent processing equipment is an embodiment of this invention. Subsequent growths and processes which take advantage of the flexible nature of the freestanding nitride veneer to flex, bow, twist, vibrate, and distort before, during, and after processing is a preferred embodiment of this invention.

Stress on a surface has been shown to modify the composition and structure of subsequent growths. Not only are nitrides anisotropic and piezoelectric in nature, but their lattice constants vary significantly with pressure. The interaction of and effects of internal piezoelectric fields both static and transient are the subject of intensive research as these fields can effect current droop, gain (both optical and electrical), resistivity, as well as basic properties such as hole and electron mobility. The flexible nature of the freestanding nitride veneer allows relaxation and/or strain of the various crystal planes which can be used to modify the properties of both the freestanding nitride films and/or subsequent growths. As such the flexing of nitride veneers to enhance, change, and/or substantially modify the properties of subsequent growth processes is a preferred embodiment of this invention. The nitride veneer may be flexed via mechanical means, electrostatic means, gas pressure, magnetic fields, and spatially varying heating via actinic radiation. The use of actinic radiation to modify, clean, etch, pattern and diffuse species into the nitride veneer is also disclosed. The use of LPE, electron beam, ion beam, and other diffusion based approaches as known in the art to modify, introduce a species, clean, and bond onto or into a nitride veneer is also disclosed.

A preferred method of forming the nitride veneer is based on laser liftoff of HVPE grown nitride layers from sapphire wafers as disclosed previously by the authors and included by reference. Critical to this process is the surface quality and crack free nature of the growth prior to liftoff. Alternately, the use of mechanical separation, chemical separation, photochemical separation, and/or use of a sacrificial growth substrate that is subsequently etched away is included as reference. HVPE is the preferred method of formation based on crystal quality, low alpha, and surface quality. The nitride veneers maybe doped, undoped, or semi-insulating in nature. The use of gradient doping, step doping, or uniform doping in the nitride veneer is also disclosed. The incorporation of an epitaxially grown stress skin on nitride layer prior to separation to enhance the robustness of the nitride veneer is an embodiment of this invention. The nitride veneer may consist of any dilute nitride including but not limited to GaN, AlGaN, InGaN, AlInGaN, as well as alloys of As and P. Most preferred are GaN doped with at least one of the following dopants, Si, Zn, Mg, Ga, Al, and rare earths. Dopants may be used to impart conductivity, semiconducting, and/or luminescent properties to the nitride veneers. Luminescent nitride veneers are an embodiment of this invention. The use of luminescent veneers as wavelength converters, gain media, and/or sensors is an embodiment of this invention.

Also disclosed is a rapid thermal growth reactor which takes advantage of the low thermal time constant of the nitride veneer. The thermal time constant of a material is directly related to the volume of material used. In any device growth layer thickness control and the interface between individual layers is determined by how quickly reactor process conditions can be changed. As an example, a typical quantum well in the blue led is 30 Angstroms thick. As such conventional nitride growth reactors must use very low growth rates and MO sources to resolve these thin layers and create reasonable interfaces between the layers. A typical LED MOCVD growth process can be up to 8 hours. Not only does this increase device cost but the extended growth cycle increases susceptibility to power interruptions and mechanical failures. The use of the nitride veneers disclosed in this filing allows for a whole new class of reactor designs which take advantage of the low thermal time constant of the nitride foils. The low thermal time constant of the freestanding nitride veneers disclosed enable heating rates in excess of 1000 C/sec and cool down times on the msec time scale. In order to take advantage of these benefits the reactor must use rapid heating methods including but not limited to direct heating of the nitride veneers via laser or other actinic radiation, process gas valves and flow rate sensors with millisecond response times, low volume reaction chambers, and control systems with millisecond response times. A preferred embodiment of this reactor is based on halide based sources such as but not limited to InCl3 and GaCl3. The high growth rate and high purity of these sources on nitride veneers allow for LED growth cycles of less than 30 minutes. The use of ALD is a preferred method of operation for this reactor. InCl3 sources must be heated to up to 300 C to provide sufficient vapor pressure for high deposition rates as such the use of high temperature ALD valves as produced by Swagelok in a rapid thermal nitride ALD reactor is a preferred embodiment of this disclosure.

DETAILED DESCRIPTION OF DRAWINGS

Figure 1:
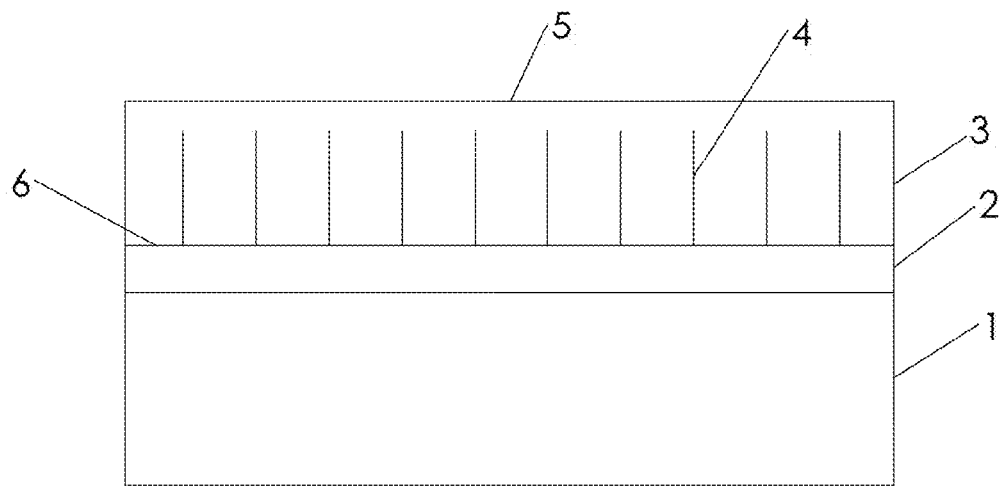
FIG. 1 depicts a nitride template on sapphire.

FIG. 1 depicts a prior art typical template. Non-native growth substrate 1 may include but not limited to sapphire, SiC, Si, and glass. A nucleation layer 2 may be used to initiate growth and compensate for lattice mismatches. In the case of sapphire non-native growth substrates 1 nucleation layer 2 may include but not limited to low temperature GaN, AlGaN, AlN, ZrB2, as well as other buffers known in the art. Nitride layer 3 is typically 2 to 5 microns thick due to stresses induced due to the lattice mismatches between the nitride layer 3 and non-native growth substrate 1. Nucleation layer 2 may also provide a weak mechanical interface via a porous nature and/or chemical suspectibility to allow for selective chemical etching. A preferred method of removal is via laser liftoff as disclosed previously. In order to compensate for the lattice mismatches dislocations 4 occur within nitride layer 3. It is well known within the art that the density of these dislocations 4 decrease with increased nitride layer 3 thickness. The stress profile between surface 6 and surface 5 can be varied based on growth conditions. One of the fundamental problems with template based approaches is the bow created by the lattice mismatch between the nitride layer 3 and non-native growth substrate 1. Depending on growth conditions and the use of stress control layers the template can be virtually flat at room temperature or strongly bowed. However a template which is flat at room temperature will be bowed at growth temperature and vice versa for the template which is bowed at room temperature. This is also difficult to control especially for thick template growths. To complicate things further the coefficient of thermal expansion versus temperature curves are typically different for the non-native substrate 1 and nitride layer 3. This dramatically limits the temperature ramp rates of any process using the template approach. This is especially true for templates greater than 10 microns in thickness and wafers greater than 2 inch in diameter. This has led to yields of less than 50% for 4 inch wafers even with nitride layers 3 of only a few microns. The typical failure mechanisms are epi layer cracking and/or delamination, or cracked templates. Since typically high rotational speeds are used on the platens in nitride reactors, cracked templates can fly within the reactor leading to extensive damage of the reactor itself not to mention yield losses. The stresses at surface 5 can also affect the rate of growth especially in the case of InGaN. For these reasons as well as others the use of a freestanding nitride veneer as disclosed within this invention is distinctly advantageous over a template based approach.

Figure 2A:
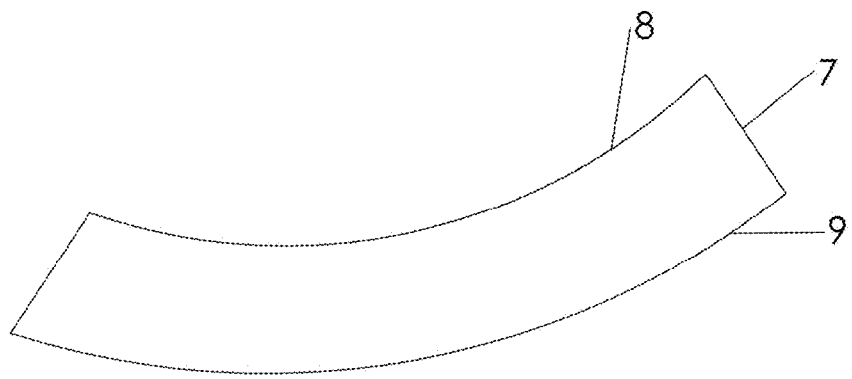
FIGS. 2A and B depicts a freestanding nitride veneer.
Figure 2B:
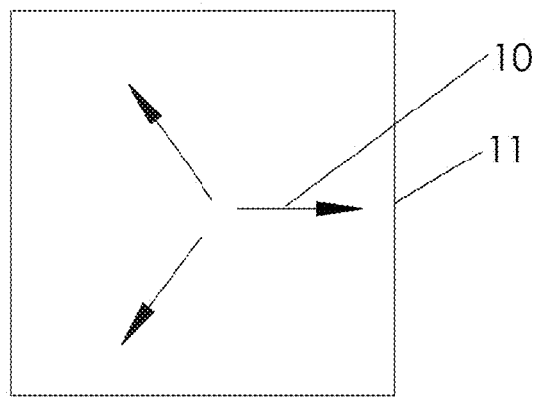

FIG. 2A depicts a freestanding nitride veneer 7. This layer is preferably between 20 and 150 microns thick with a surface greater than 0.5 cm2. Even more preferably the freestanding nitride veneer 7 is between 30 and 100 microns thick and greater than 1 $cm^2$ in area. Freestanding nitride veneer 7 maybe doped, undoped, or semi-insulating. Gallium nitride is a preferred embodiment, however all dilute nitrides are also embodiments of this invention. Freestanding nitride veneer 7 maybe be doped with a variety of materials including but not limited to Si, Mg, Zn, Ga, Fe, and rare earths. These dopants maybe uniformly or non-uniformly doped into the freestanding nitride veneer 7. The dopant levels maybe up to and including degenerative levels. The dopants may be used to impart conductivity, semi-insulating and/or luminescent properties to the freestanding nitride veneer 7. The use of LPE, ion implantation, thermal diffusion as well as other doping methods as known in the art to create at least a region of doped nitride material within one side, both sides, or the entire thickness of freestanding nitride veneer 7 is disclosed. Surface 9 is typically the side which was attached to the non-native growth substrate which as such tends to have the higher dislocation density. Surface 9 is typically textured due to the liftoff process and may include part of the nucleation layer described previously. The texturing of surface 9 to enhance light extraction, control stress, prescribed for subsequent cleaving operations, and texturing for enhanced regrowth are all embodiments of this invention. The use of excess gallium formed during separation especially laser liftoff as a dopant for subsequent growth is also an embodiment of this invention. Typically the stresses found within freestanding nitride veneer 7 leads to a uniaxial bow which aligns to one of the crystal planes. FIG. 2B depicts a square freestanding nitride veneer 11 in which a cleavage plane is substantially oriented to one edge of the square freestanding nitride veneer. Alternately, a triangular freestanding nitride veneer is disclosed whereby three cleavage planes are substantially oriented to three edges of the triangular freestanding nitride veneer. In this configuration stresses are balanced leading to cup shaped bow across the freestanding nitride veneer 11. Hexagon, parallelograms, and other shapes that can be formed based on equilateral triangles are also disclosed. The use of shape to tailor bow and stress within freestanding nitride veneer 11 are also disclosed. In particular the use of shape to create non-flat layers with modified stress profiles to enhance mounting and/or improve performance of devices formed on freestanding nitride veneer 11 is disclosed. While c plane nitrides are a preferred embodiment the formation of freestanding nitride veneers 11 on other crystal planes are also disclosed. The preferred shape of the freestanding nitride veneer 11 would be adjusted to account for the new cleavage planes created by the new crystal plane orientation and is an embodiment of this invention. In general, the combination of thickness, crystal orientation, and shape is disclosed as a method of modifying the stress profile within nitride veneers. The formation of layered structures with substantially similar, opposite, and/or different thicknesses, crystal orientation, and shape to create a particular stress profile within at least one of the layers is disclosed. A preferred embodiment is that at least one of these layers be a freestanding nitride veneer 11. Semiconducting and non-semiconducting materials including, but not limited to, polymers, metal, semiconducting layers (silicon, etc.) and dielectrics. The use of direct waferbonding, adhesive bonding, and/or high temperature glass frits to adhere at least on nitride freestanding veneer 11 to another layer is disclosed. Formation of stacked freestanding nitride veneers 11 for 3 dimensional packaging is disclosed. The use of this technique to create optoelectronic packages which take advantage of the optical transmittance of at least one freestanding nitride layer 11 in the 3-dimensional packages is a preferred embodiment. The attachment of temporary films polymeric, glass, metals, or semiconductor layers for handling, induce a bow, and/or enable subsequent processing steps is also disclosed. The application of a photoimagible film to at least one side of freestanding nitride veneer 11 is a preferred article of this invention.

Figure 3:
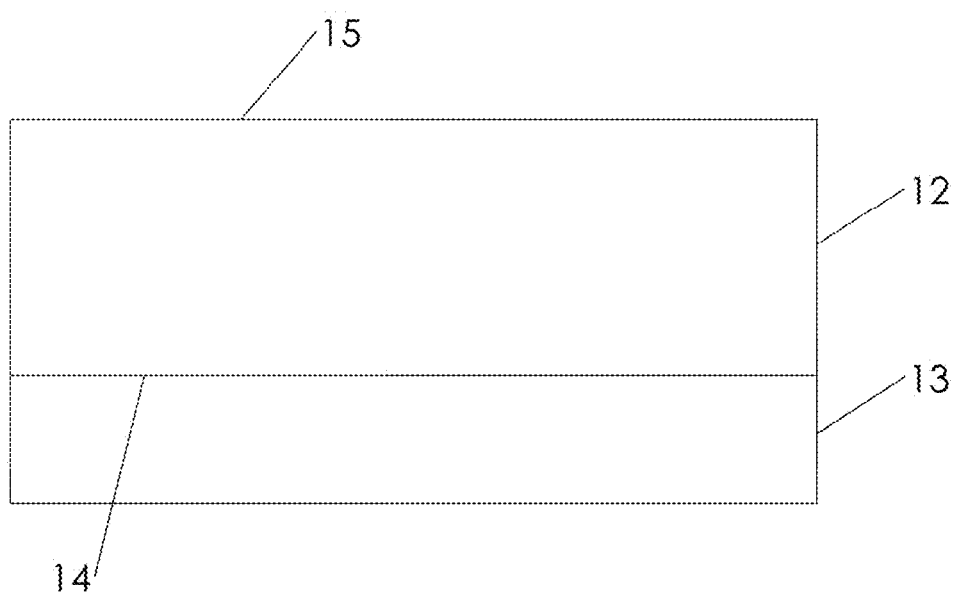
FIG. 3 depicts a freestanding nitride veneer with at least one additional semiconductor layer.

FIG. 3 depicts a freestanding nitride veneer 12 with at least one additional layer 13. Additional layer 13 may consist of but not limited to an organic or inorganic material. Preferably additional layer 13 may consist of but not limited to metal, dielectric, and/or semiconducting layer. More preferably, said additional layer 13 may be a layer deposited by but not limited to sputtering, LPE, MBE, MOCVD, HYPE, ALD, evaporation, spraying, dip coating, printing, and/or spin coating. The use of conversion methods using thermal processes, actinic radiation, ion implantation, etching, chemical means using at least one freestanding nitride veneer and at least one additional layer 13 is disclosed. The at least one additional layer 13 may be spatially varying or uniform. The at least one additional layer 13 may be permanent or sacrificial in nature. Surface 14 between the freestanding nitride veneer 12 and at least one additional layer 13 maybe be either side of freestanding nitride veneer 12. The use of texturing, chemical treatments and/or actinic radiation means either uniformly or spatially varying to adjust, enhance, modify, change the wetting characteristics, and/or roughen surface 14 is disclosed. More preferably the modification of surface 14 to modify/enhance the adhesion, crystal quality, stress profile, and/or transport properties between or of either at least one additional layer 13 and/or freestanding nitride veneer 12 is disclosed. As an example the selective etching of the nitride face of a freestanding gallium nitride veneer such that enhanced lateral growth methods can be used to regrow via HVPE a higher crystal quality nitride layer is disclosed. As another example the use of laser ablation to form microoptical CPC in the freestanding nitride veneer 12 prior to deposition of a multilayer dielectric mirror is disclosed. Alternately, surface 15 may be modified as well for the formation of microoptical elements, extraction means, and/or mechanical elements. The modification of any of these layers via chemical, actinic radiation, implantation, and/or mechanical means is also disclosed. A preferred embodiment of the invention is the formation of a freestanding nitride veneer 12 and at least one additional layer 13 which consists of a semiconductor with substantially different bandgap than the freestanding nitride veneer 12. As an example at least one additional layer 13 would consist of a low bandgap material such as but not limited to silicon, silicon/germanium, germanium, gallium arsenide, alingap, dilute nitrides, InP, antinomides, and ZnO alloys. The use of this layered material in solar cells, laser diodes, LEDs, electronics is disclosed. More preferably the use of this layered material in multijunction solar cells is disclosed. Because of the substantially single crystal nitride and mechanically flexible nature of freestanding nitride veneer the need for buffer layers and other methods such as twist wafer bonding to enhance lattice matching can be eliminated. Direct epitaxial growth of substantially single crystal InSb on freestanding GaN veneers have been demonstrated even though very large lattice mismatches are present. Enhanced growth rates and indium concentrations for InGaN based on freestanding nitride veneers 12 have also been demonstrated due to reduced surface stresses of the veneers. Since additional polishing steps are not required by these veneers versus bulk nitride wafers processing costs and surface defects can all be reduced. The epitaxial growth of but not limited to nitrides, oxides, antimonides, phosphides, diamond, silicon, si/ge, arsenides, and other semiconducting, dielectric, ferromagnetic, and/or luminescent materials with enhanced material properties relative to template and/or bulk nitride approaches is disclosed. The use of the high temperature nature of freestanding nitride veneer 12 to allow for recrystallization, annealing, and/or modification of at least one additional layer 13 is disclosed. Even more preferably, the use of the thermal shock resistant nature of the freestanding nitride veneer 12 to enable rapid thermal processing of at least one additional layer 13 is an embodiment of this invention.

Figure 4:
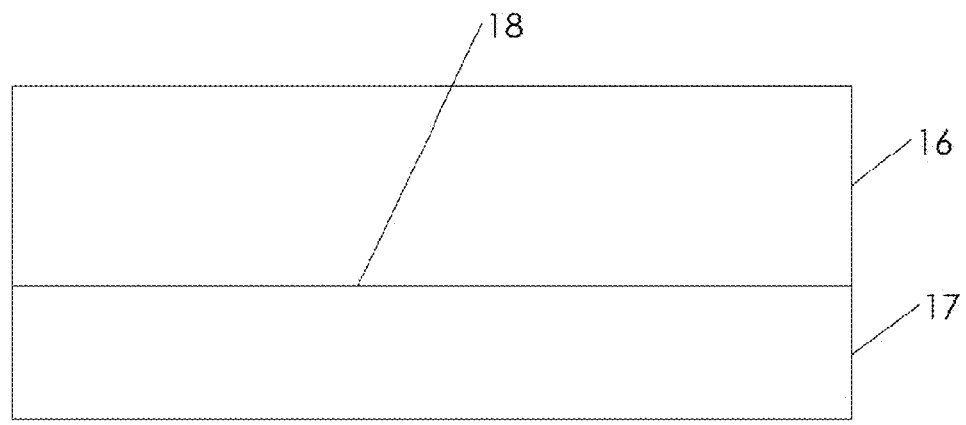
FIG. 4 depicts a freestanding nitride veneer with a buffer layer.

FIG. 4 depicts a freestanding nitride veneer 16 with a buffer layer 17. The buffer layer 17 maybe epitaxial or non-epitaxial in nature. Typically the layer is formed on surface 18 via epitaxial means but amorphous layers are also disclosed. Alloys of nitrides are a preferred embodiment with thicknesses ranging from several angstroms to a micron. Texturing, chemical modification, and actinic radiation either uniformily or spatial varying in nature of at least one surface of nitride veneer 16 is disclosed. Formation of the buffer layer via diffusional techniques as known in the art is also an embodiment. At least one freestanding nitride veneer 16 with a buffer layer 17 which enhances subsequent processes and layer formation is an embodiment of this invention.

Figure 5:
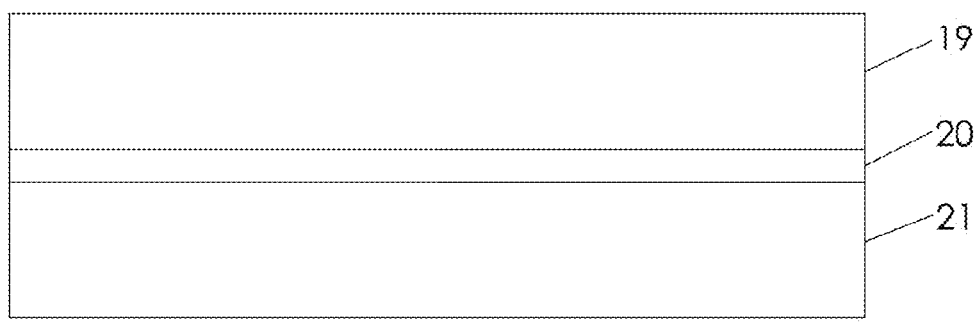
FIG. 5 depicts a freestanding nitride veneer with a buffer layer and low bandgap coating.

FIG. 5 depicts freestanding nitride veneer 19 with at least one buffer layer 20 and at least one additional layer 21. At least one additional layer 21 may consist of a metal, dielectric, and/or semiconductor. Even more preferred at least one additional layer 21 is a semiconductor with a bandgap substantially different from freestanding nitride veneer 19. The use of this layered material in semiconductor devices including but not limited to solar cells (single and multijunction), Power devices, RF devices, sensors, MEMS, laser diodes, spintronics, optoelectronics, and memories is disclosed. Preferred materials for at least one additional layer 21 include but not limited to silicon, germanium, GaAs, InP, nitride alloys, oxide alloys, dilute nitrides containing As, P, etc., semiconducting organics, and luminescent materials which are amorphous, polycrystalline and crystalline. At least one additional layer 21 may be function as a dielectric, semiconductor, and/or conductor. Semiconducting materials in additional layer 21 may be p type, n type, degenerative, and/or semi-insulating. The selection of buffer layer 20 and/or additional layer 21 such that the stress profile in any of the layers depicted is modified is an embodiment of this invention. The bending of the layers relative to a particular crystal plane prior, during, and/or after growth of the at least one buffer layer 20 and/or at least one additional layer 21 is disclosed. Using this technique the stress and growth characteristics of the various layers can be modified. The use of the modified strain layers to enhance material properties is an embodiment of this invention. The use of this technique to enhance dopant concentration, decrease dislocation density, and enhance growth rates is an embodiment of this invention. More preferably, the bending of freestanding nitride veneer 19 during formation of at least one buffer layer 20 and/or at least one additional layer is an embodiment. Bending may be via mechanical, electrostatic, magnetic and/or non-uniform heating means.

Figure 6:
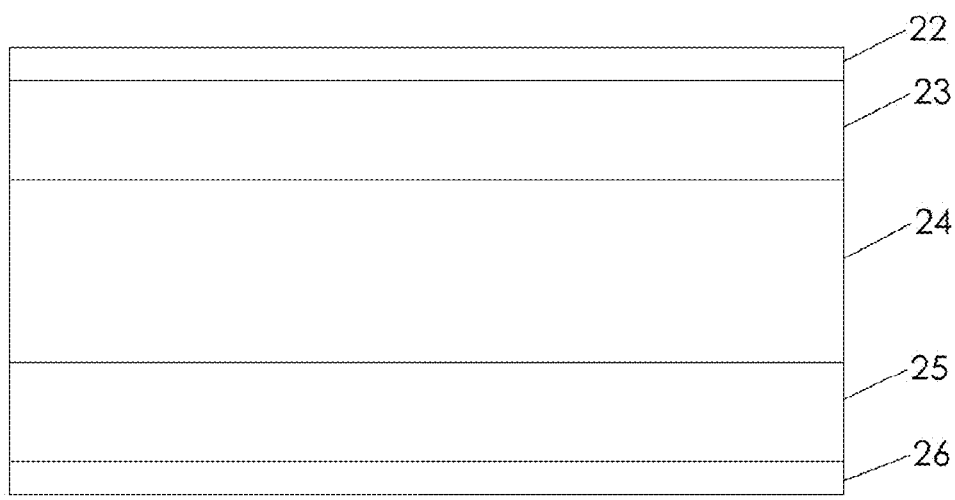
FIG. 6 depicts a multi junction solar cell based on nitride veneer with silicon junction.

FIG. 6 depicts a freestanding nitride veneer 24 with at least one nitride solar junction 23 which may consist of PN, DHJ, SQW, MQW and/or quantum dot based devices. At least one nitride solar junction 23 is substantially composed of nitrides. At least one low bandgap solar cell 25 is grown on the other side of freestanding nitride veneer 24. At least one low bandgap solar cell 25 may consist of PN, DHJ, SQW, MQW and/or quantum dot based devices. The advantages of this approach relate to ability to grow a fully integrated structure covering the majority of the solar spectrum, ability to grow high temperature structures prior and/or independently of structures which require lower temperatures, and ability grow higher quality low bandgap materials using freestanding nitride veneer 24 as a growth substrate. Contact layers 22 and 26 allow for extraction of current from the device. Contact layers 22 and 26 may consist of but not limited to transparent conductive oxides, metal traces, and combinations of both. The design of either and/or both contact layers 22 and 26 to provide antireflection, surface texturing for enhanced absorption, and/or improved current spreading is disclosed. The device may be constructed such that light passes through such that additional devices can be stacked together or have one contact layer opaque and reflective such that incident light is reflected back through the layers for additional opportunity of conversion. Alternately, solar junctions made using ZnO alloys may be used to replace at least one nitride solar junction 23.

Figure 7:
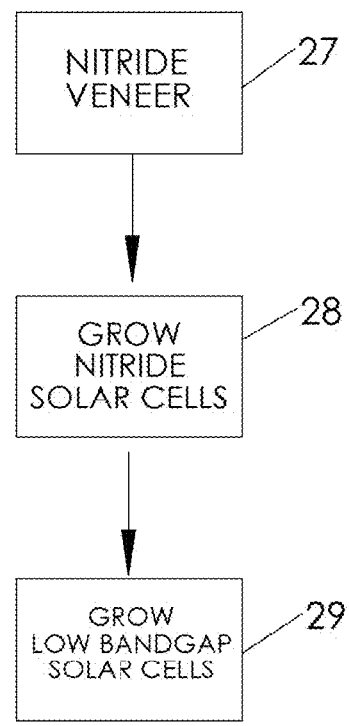
FIG. 7 depicts a process for making integrated multijunction solar cells using nitride veneers.
Figure 7:
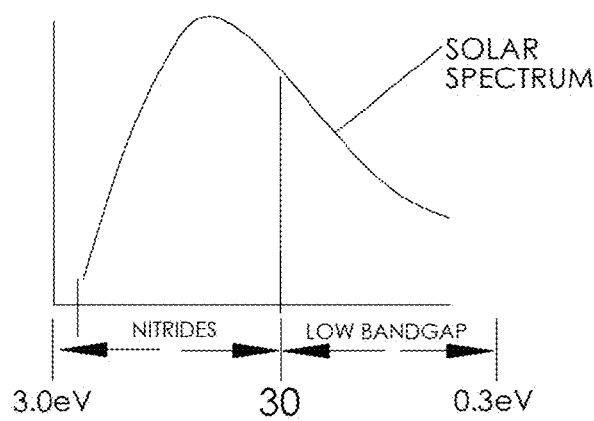

FIG. 7 depicts a process for forming multijunction solar cells. In this process a freestanding veneer is formed in step 27. On the freestanding nitride veneer at least one nitride solar cell is formed in step 28. This is followed by the growth of at least one low bandgap solar cell in step 29. The use of this approach enables the formation of freestanding solar cells which can be optimized for the solar spectrum. Nitride alloys can span the majority of the solar spectrum However it is difficult to grow high indium content devices which the efficiency and p type properties needed. Alternately, the growth quality nitride devices limits the type of low bandgap materials which can be used due to lattice mismatch and temperature constraints of the low bandgap materials. In a typical GaN on silicon approach the quality of the devices is limited not only the quality of the GaN which can be produced using silicon as a growth substrate but the underlying junctions needed in the silicon solar cell are compromised by the subsequent high temperature nitride growth. Therefore a preferred embodiment of this invention is the formation of at least one nitride solar cell on a freestanding nitride veneer followed by the formation of at least one low bandgap solar cell on the freestanding nitride veneer. While a sapphire growth substrate maybe used to grow the nitride solar cell then followed up with a low bandgap solar cell, the sapphire substrate introduces thermal and optical problems into the device. As stated before the problems associated with growing a template like this still exist and the quality of devices is compromised. FIG. 7 also depicts Graph 30 which illustrates how the solar spectrum can be divided into two basic zones, with the at least one nitride solar cells optimized for efficient operation for the higher energy photons and the at least one low bandgap solar cells optimized for efficient operation for the lower energy photons. The overlap is determined by the materials being used. The use of double, triple and higher number of quantum wells, quantum dots, and other solar converting devices to efficiently cover the majority of the solar spectrum for maximum efficiency is disclosed. The use of layer thickness control, antireflecting layers, current spreading layers, surface texturing, internal structures, and the use of multiple stacked devices to enhance the efficiency is also disclosed. As previously disclosed by the author the use of spatially varying composition and thickness within the device and spectrum splitting optics to form a rainbow across the solar cell is also included as an embodiment.

Figure 8:
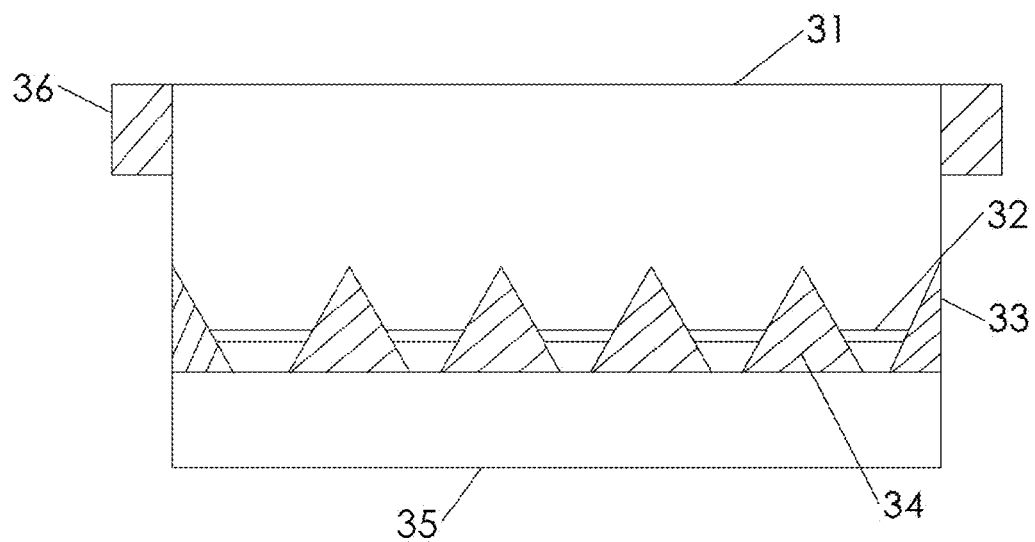
FIG. 8 depicts a LED array with a silicon actively addressed matrix grown on a nitride veneer.

FIG. 8 depicts an active matrix addressed freestanding nitride veneer LED array. Freestanding nitride veneer 31 contains an array of LEDs 32, which are grown on the freestanding nitride veneer 31 and segmented into individual elements via trenches 33 cut into the freestanding nitride veneer 31. The thickness of the freestanding nitride veneer 31 enables the formation of micro CPCs which direct light from the individual LEDs 32 outward. The use a barrier 34 to prevent cross talk between the individual LEDs 32 is also disclosed. Barrier 34 maybe a metal, a dielectric and/or a combination of both, in the case of the dielectric the use of a material with a lower refractive index than the freestanding nitride veneer 31 is preferred to enhance internal reflection of the CPC. The growth of an active matrix backplane 35 is also disclosed which can be used to address the individual LEDs 32. A common contact 36 maybe formed either as shown or within the barrier 34 region.

Figure 9:
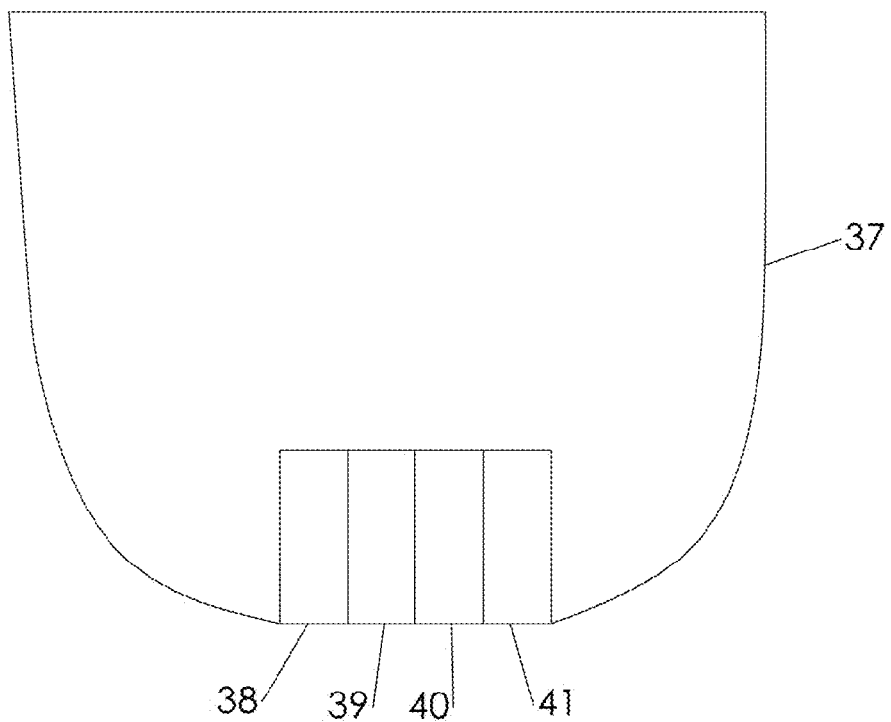
FIG. 9 depicts stacked multi junction devices based on nitride veneers.

FIG. 9 depicts stacked freestanding nitride veneer based solar cells 38,39,40 and 41 contained within a CPC 37. CPC 37 maybe 3 dimensional, linear, and/or approximated by a simple V shape. CPC 37 maybe air, liquid, or solid filled. Most preferably, stacked freestanding nitride veneers based solar cells 38, 39, 40, and 41 are sandwiched within a glass CPC which provides concentration of incident solar energy and thermal cooling of the solar cells.

Figure 10:
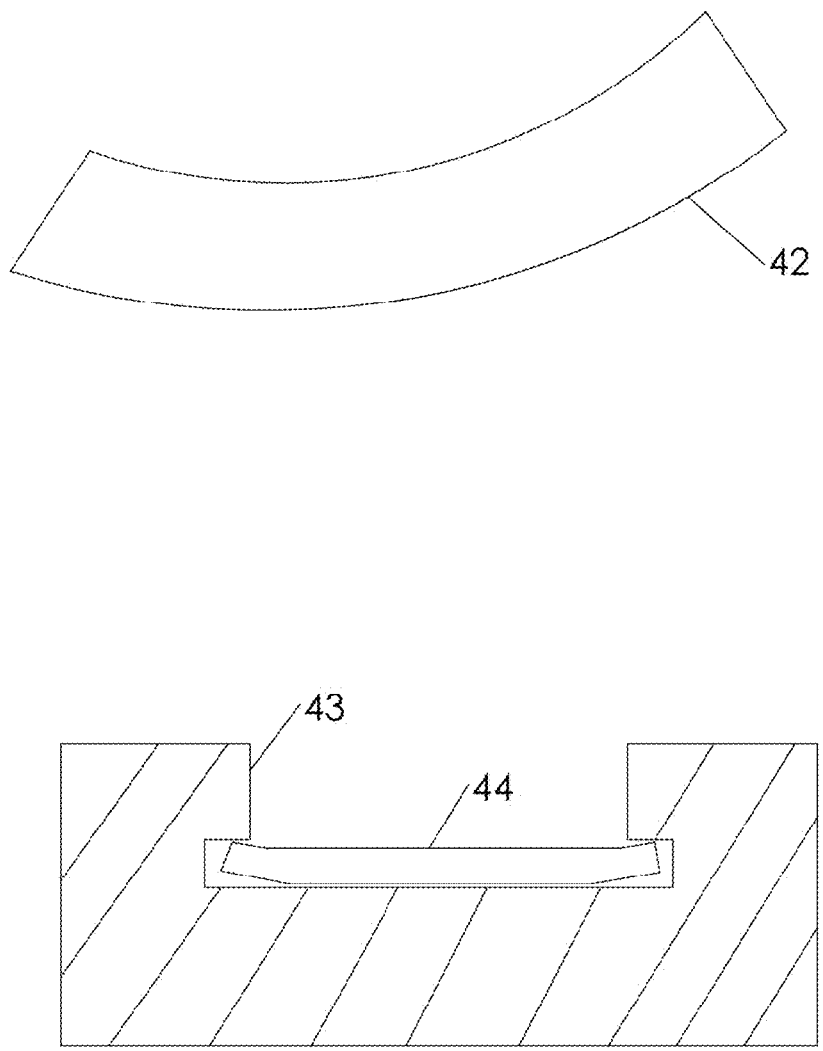
FIG. 10 depicts a flexed veneer during subsequent growth.

FIG. 10 depicts a freestanding nitride veneer 42 with uniaxial bow as depicted. The bow is defined by the stress profile within the freestanding nitride veneer 42. Since many of the performance parameters within nitride devices are determined by the spontaneous and induced polarization fields within the device itself flexing of the freestanding nitride veneer can be used to modify device performance. FIG. 10 also depicts a simple mounting fixture 43 based on using the bow of the freestanding nitride veneer 42 to hold itself in place during processing. The constrained freestanding nitride veneer 44 will exhibit different properties depending on the amount, direction, and type of flex induced by the mounting fixture 43. Both static and dynamic flexing of the freestanding nitride veneer 42 is disclosed. In the case of dynamic acoustical, piezoelectric, and capacitive means can be used to vibrate the freestanding nitride veneer 42 during subsequent processing steps.

Figure 11:
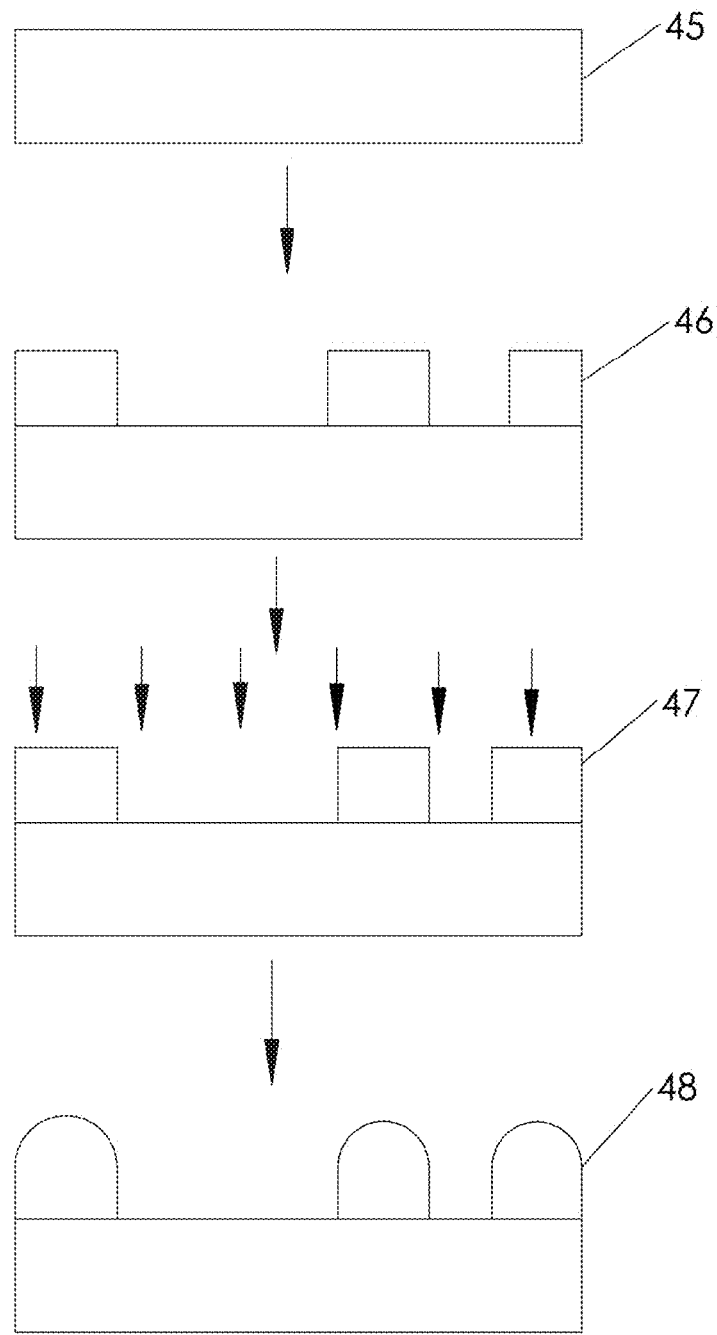
FIG. 11 depicts high temperature contacts formed on nitride veneers.

FIG. 11 depicts a printing process for forming ohmic contacts to nitride veneer based devices. Freestanding nitride veneer 45 is processed to contain semiconducting devices including but not limited to LEDs, laser diodes, HEMTs, solar cells, and other electronic/optoelectronic devices. Thick film high temperature conductor 46 is printed on to the freestanding nitride veneer 45 via stenciling, inkjet, and photoimaging approaches. Curing means 47 may include any actinic radiation including but not limited to RF heating, IR heating, laser, and combinations of both. Preferred is the use of rapid thermal heating techniques IR, laser, and/or electron beam based. The freestanding nitride veneer 45 enables the use of rapid thermal processing of over 1000 C/minute. Cured contact 48 is formed after firing. A preferred material for cured contact 48 is substantially metal contacts with high reflectivity including but not limited to silver, platinum, palladium and their alloys.

Figure 12:
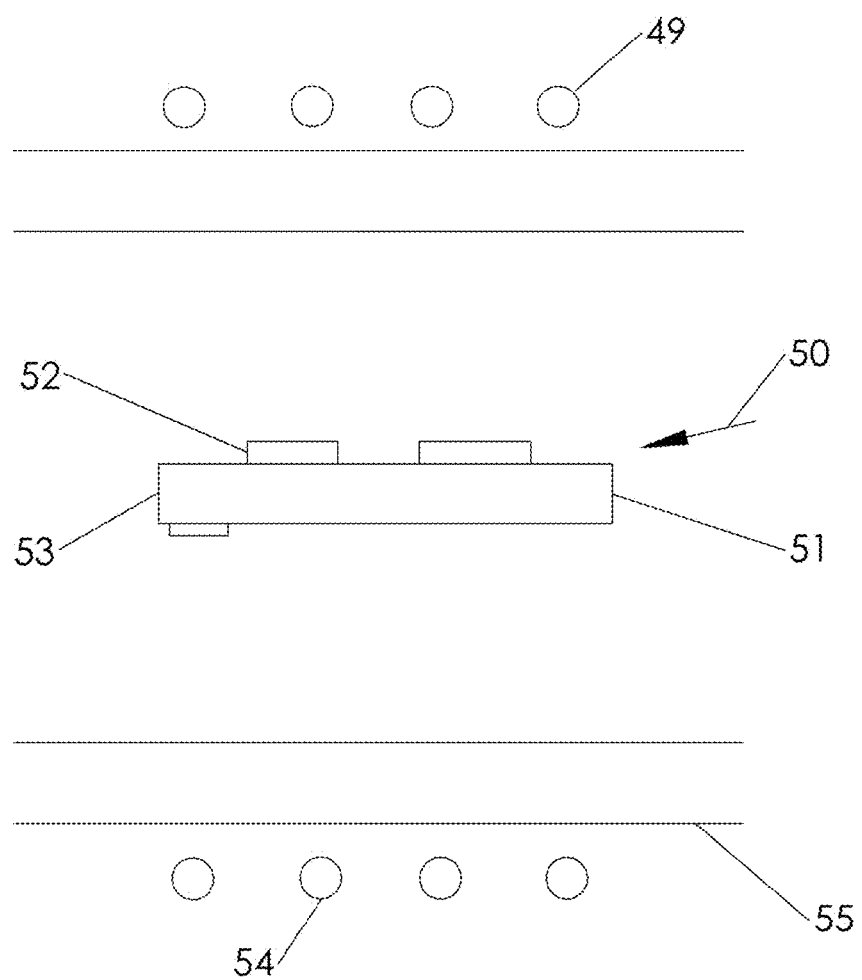
FIG. 12 depicts a rapid thermal process reactor designed for nitride veneers.

FIG. 12 depicts a rapid thermal processing reactor designed for freestanding nitride veneers 52. As stated previously conventional template based approaches for nitrides can be damaged by rapid thermal cycling. This limits both how rapidly devices can be made as well as the precision of doping and quality of the interface between layers. This has a direct impact on ultimate device performance. Interfaces between layers are also greatly impacted by how rapidly reactor processing conditions can be changed. As an example a horizontal reactor is depicted in FIG. 12. Vertical and rotating designs are also embodiments of this invention. Because freestanding nitride veneers 52 are substantial homogenous very rapid temperature changes are possible. Heating rates in excess of 1000° C./sec have been demonstrated. The low thermal mass nature of freestanding nitride veneers 52 allows for very rapid thermal temperature changes. In this reactor design IR lamps 49 and 54 are used to heat freestanding nitride veneers 52 which are mounted to a thin susceptor 51. Alternatively, laser or other actinic radiation sources may be used to heat the freestanding nitride veneers 52 either directly or indirectly via a coating layer on the freestanding nitride veneers 52 or via a thin susceptor 51. A preferred embodiment of this invention is direct heating of the freestanding nitride veneers 52 via actinic radiation is disclosed. Cooling is via process gases 50 contained within reactor chamber 55. The low thermal mass of the freestanding nitride veneers 52 dramatically reduce the cooling time constant relative to conventional growth substrates. As the reactor chamber 55 volume must be minimized and process gases 50 flow rates must be maximized to take advantage of the low thermal mass of the freestanding nitride veneers 52. Preferred is reactor chamber volume of less than 10 cc. It is a preferred embodiment that reactor chamber 55 be substantially transparent to the radiation emitted by IR lamps 49 and 54 or other actinic radiation used to heat freestanding nitride foils 52 Alternatively, the use of RF heating and an appropriate susceptor 51 is also disclosed. The low thermal mass of freestanding nitride veneers 52 and thin susceptor 51 is critical for cooling processes as well as heating processes within the reactor. Temperature control is via thermocouple 53 which controls the IR lamps 49 and 54. The use of multiple thermocouples 53 to control zones and/or lamps individually is also disclosed. The use of alternate temperature sensing means including but not limited to band edge sensors and pyrometers is also disclosed. Thin susceptor 51 maybe be solid or contain hole whereby a substantial portion of both sides of freestanding nitride veneers 52 are exposed to the process gases 50 and IR radiation from IR lamps 49 and 54. In this manner both sides of freestanding nitride veneer 52 can be grown on. Direct heating of the freestanding nitride veneers 52 via actinic radiation is also disclosed. Typically MOCVD growth rates are less than 1 micron/hour. However that represents 10000 angstroms/hour or several angstroms/second. Quantum wells are typically tens of angstroms thick and consist of two or more distinctly different compositions and/or doping levels. There can be more than 100° C. difference in the processing temperatures for the various layers within a device. In addition process gases must typically be switched to create the optimum device structure. The quality of the device is also determined by the interface between the various layers. InGaN is especially susceptible to the formation of defects and rough interfaces within MQW structures. Indium has a tendency to segregate during crystal growth which leads to composition fluctuations and defect formation in the thin layers required. The ability to rapidly change the growth temperature of the substrate and process gases within the reactor are critical to controlling the overall device structure. As an example, argon, ammonia, nitrogen, hydrogen, or combinations of carrier gases are provided at given pressure through a precision pressure regulator via electropolished stainless steel tubing into a high temperature oven zone heated via heating means including block heaters and liquid heater lines. Multiple high temperature oven zones may be used to provide different reactant to process gases 50. Each high temperature oven zone should be thermally isolated from each other. The high temperature oven zone has sufficient thermal mass to equalize the temperatures of the high temperature ALD valves and solid metal chloride/halide sources. Optionally, integral disposable oxygen scavenger type filters with metal mesh filters are placed at the input and output of the solid metal chloride or halide sources. Examples of solid metal chloride or metal halide sources are but not limited indium chloride, gallium chloride, aluminum chloride, indium iodide, gallium iodide, indium bromide, gallium bromide. Purity levels equal to or greater than 6N is preferred. The in-line disposable scavenger filters remove any oxygen from the carrier gases and residual oxygen in the solid sources as well as prevent particles from entering the reactor chamber. In-situ activation of these in-line disposable scavenger filters is preferred. A typical operating temperature would be 300 C for InCl3 and 60 C for GaCl3 as an example. One or more solid metal chloride or metal halide sources, carrier gases, high temperature ALD valves, in-line filters, and high temperature oven zones can be used to create the appropriate process gases 50 to go into reactor chamber 55. Ammonia, nitrogen, hydrogen, and argon may also be digitally introduced into reactor chamber 55 via a separate set of high temperature ALD valves. It should be noted that the temperature of these additional process gases 50 and carrier gases used entrain the reactants must be carefully regulated to prevent undesired cooling of the solid metal chloride or metal halide sources, the reactor chamber 55, or the freestanding nitride veneers 52. The use of high temperature ALD valves allow for full digital control of process gasses 50 into reactor chamber 55. A typical switching time of 5 msecs is possible with these ALD valves as such process gases 50 can be introduced into the reactor chamber 55 as millisecond time scale bursts rather than the more conventional method of simply changing flow rates through bubblers with 10 second or higher time constants. The conventional bubblers must be allowed to stabilize due to how the carrier gasses flow through the liquid chamber and therefore do not lend themselves to rapid digital processes as disclosed in this filing. In addition, more conventional MO sources have very low vapor pressure which mandates very tight temperature controls (1 degree C.) on the bubblers to maintain a given concentration of reactants with process gases 50 compared to higher vapor pressure sources. Once the vapor from the solid metal chloride or metal halide sources have been entrained into the carrier gases, the resulting process gases 50 are transported via electropolished stainless steel tubing with a length less than 1 meter to reactor chamber 55. Even more preferably, the length of the stainless steel tubing is less than 10 cm. Reducing the tubing length decreases the delay time to the reactor chamber 55. Reactor chamber 55 can be a cold wall or hot wall reactor chamber. Most preferably reactor chamber 55 is maintained at a temperature equal to or greater than the highest high temperature over zone used to entrain the reactants into process gases 50. A bypass around reactor chamber 55 of the solid metal chloride or metal halide sources is also optionally disclosed. Within reactor chamber 55 as previously disclosed one or more freestanding nitride veneers 52 are positioned within the process gas 50 and heated via IR lamps 49 and 54 or optional other heating means including but not limited laser, heater elements, or other actinic radiation sources. Thin susceptor 51 may be used to indirectly heat the freestanding nitride veneers 52 or even more preferably the freestanding nitride veneers 52 are directly heated. Process gases 50 exit the reactor chamber 55. Optionally, an additional ALD valve maybe used to allow for pressurization of the reactor chamber 55. Unlike conventional MOCVD reactors this reactor design can be used in full digital mode in that reactants can be individually be sequenced into reactor chamber 55 on a millisecond time scale. This couple with millisecond temperature response of the freestanding nitride veneers 52 and IR lamps 49 and 54 is a preferred embodiment of this invention. Using this approach very distinct interfaces can be created while maintain high growth rates which ultimately determine the process cycle time. The ability to introduce process gases 50 from high vapor pressure metal chloride or metal halide source in a fully digital mode is a preferred embodiment of this invention. The use of vacuum means to further evacuate reactor chamber 55 is disclosed. Most preferably an inert gas enclosure surrounds this rapid thermal reactor for both safety and to further prevent any oxygen entrainment into the process gases 50 due to leaks within the reactor.

Figure 13:
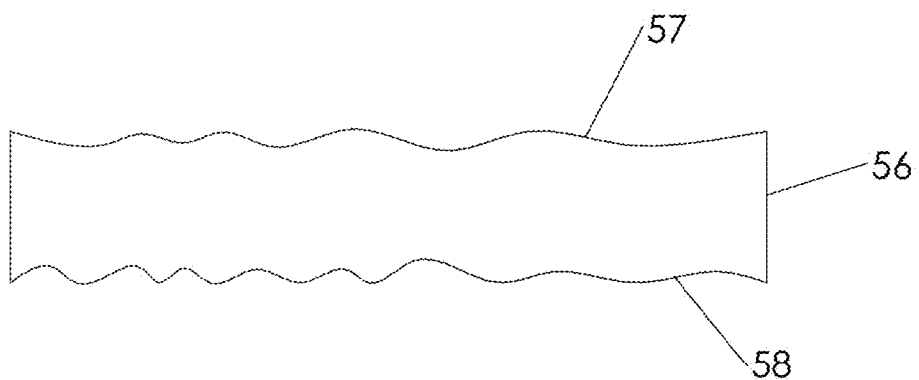
FIG. 13 depicts modification of the surfaces of nitride veneers.

FIG. 13 depicts a surface modified freestanding nitride veneer 56. The formation of photonic crystal structure, micro-optics, gratings, and other optical structures on one or both veneer surfaces 57 and 58 is disclosed. The formation of extraction elements on one or both veneer surfaces 57 and 58 is a preferred embodiment of this invention. The subsequent epitaxial overgrowth of devices over veneer surfaces 57 and/or 58 to create embedded structures is disclosed. In this manner the active region of DHJ, SQWs, MQWS and quantum dot devices can be modified. Since freestanding nitride veneer 56 has a gallium rich side and a nitrogen rich side veneer surfaces 57 and 58 maybe modified with the same or different methods depending on subsequent process steps.

Figure 14:
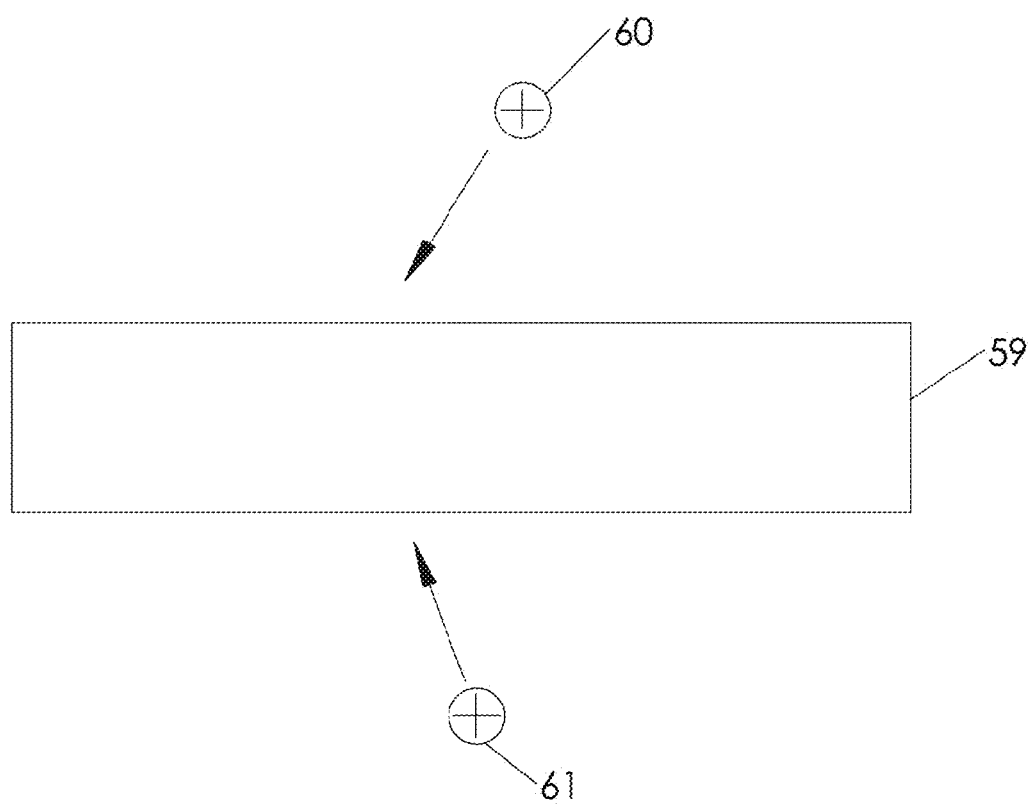
FIG. 14 depicts implantation of dopants using nitride veneers.

FIG. 14 depicts a freestanding nitride veneer 59 is which doped/modified via ion implantation 60 and 61 on one or both sides of freestanding nitride veneer 59. The use of this technique to form a large area semiconducting device is disclosed. Post processing to enhance diffusion and/or mitigate lattice damage is also disclosed.

Figure 15:
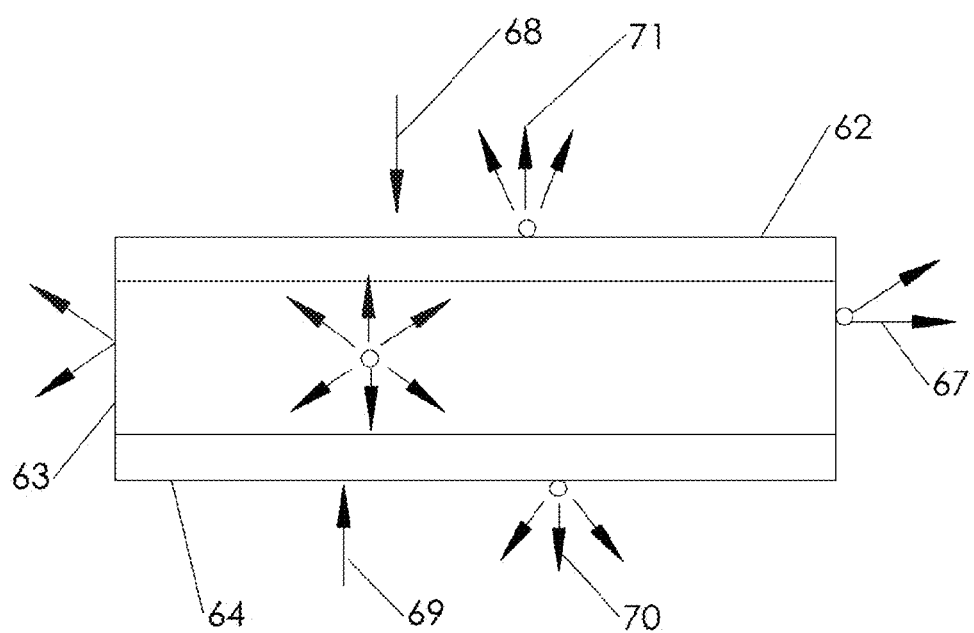
FIG. 15 depicts a luminescent nitride veneer.

FIG. 15 depicts a luminescent freestanding nitride veneer 63. In one embodiment at least one luminescent element 65 is doped into luminescent freestanding nitride veneer 63. At least one luminescent element 65 maybe include but not limited to rare earths, Zn, Sn, Bi, Sb, Li, and other ions known in the art. Alternately or in combination with bulk doping, luminescent freestanding nitride veneer 63 may be used as a growth substrate for outer layers 62 and 64. The use of the crystal quality/nature, thermal conductivity, cleavability, high processing temperature, and transmission characteristics of luminescent freestanding nitride veneer 63 to form luminescent layers via but not limited to sputtering, LPE, hydrothermal, melt processes, spin coating, evaporation, MOCVD, ALD, HYPE, MBE, and PECVD is disclosed. The use of spin coating and high temperature thermal processing/anneal up to the decomposition temperature of GaN to enhance the luminescent properties of outer layers 62 and 64 is preferred embodiment. The selection of materials for outer layer 62 and 64 with refractive indices less than luminescent freestanding nitride veneer 63 such that a waveguiding structure is formed is disclosed. In this case, edge emission 67 can be enhanced. The use of dichroic coatings, photonic crystal structures, and or microoptical elements to restrict, modify, and/or block emission 71 and 70 from the luminescent freestanding nitride veneer is disclosed. Excitation means 68 and 69 may be coupled into luminescent freestanding nitride veneer 63 outer layers 62 and 64. Alternately, excitation means 68 and 69 may be coupled into the edges of luminescent freestanding nitride veneer 63.

Figure 16:
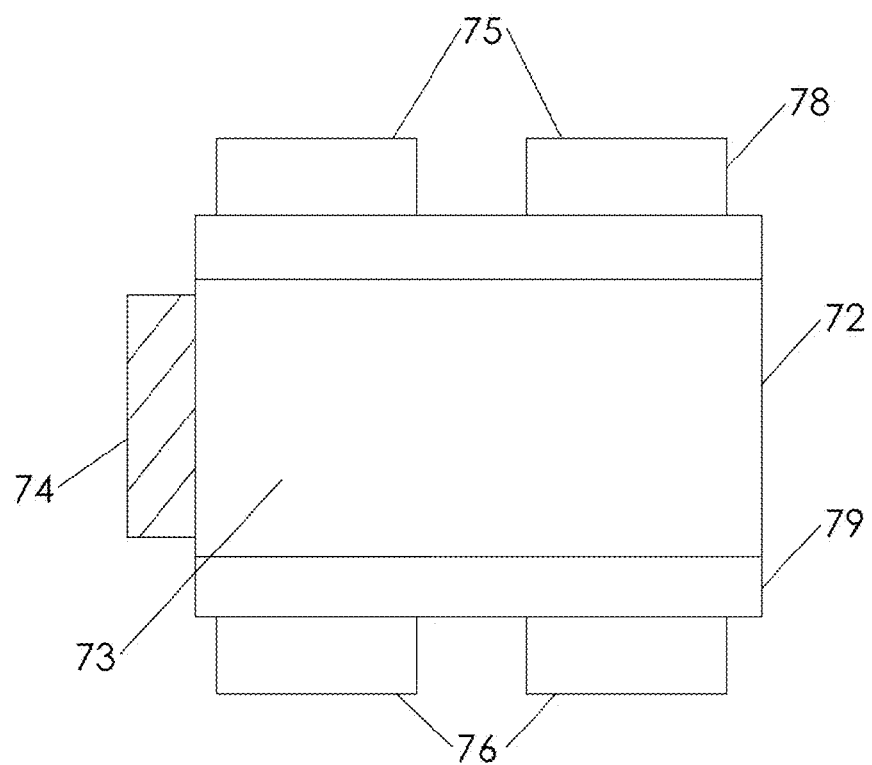
FIG. 16 depicts a solid state diode pumped doped nitride veneer laser.

FIG. 16 depicts a diode pumped laser formed using a freestanding nitride veneer 73 as the gain media. The incorporation of luminescent elements including but not limited to rare earths and Zn into freestanding nitride veneer 73 is disclosed. Alternately, the use of freestanding nitride veneer 73 as a growth substrate for formation of luminescent gain media layers 78 and/or 79 is also disclosed. In this case the optical transmission, high thermal conductivity, cleavability, and lattice characteristics are important attributes of freestanding nitride veneer 73. A preferred embodiment of this invention is the use of freestanding nitride veneer 73 as a cleavable gain media pumped via pump diodes 75 and 76. Output face 72 and reflector 74 can be used to create a laser cavity. Alternately the formation of disc and other non-linear cavities are also disclosed. The use of air and liquid cooling is also disclosed.

Figure 17:
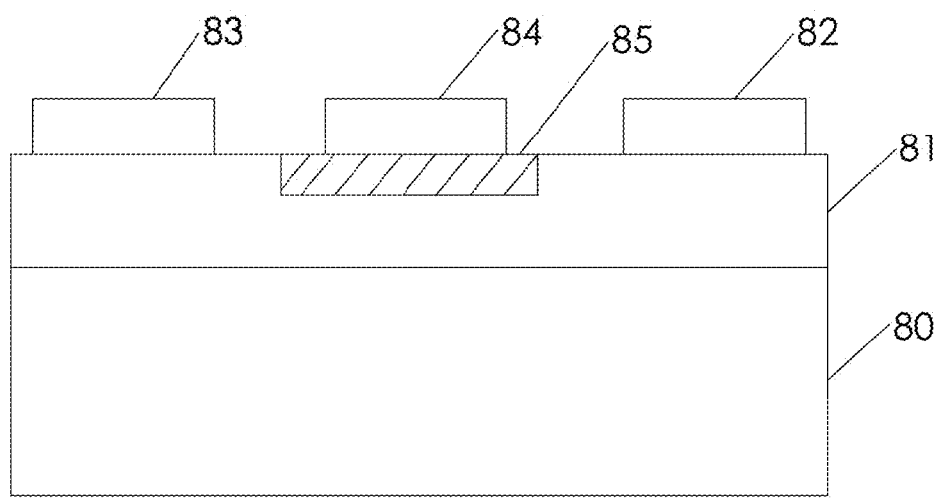
FIG. 17 depicts HEMT formed on nitride veneer.

FIG. 17 depicts a nitride HEMT on freestanding nitride veneer 80. A wide range of device structures are possible for HEMTs, but the basic design involves active region 81 in which a 2 DEG is typically formed. Current flow between Drain 83 and Source 82 is controlled via Gate 84 which modulates the current flow in region 85. The 2 DEG is typically formed between AlGaN and GaN layers in active region 81. The use of freestanding nitride veneer 80 enables the creation of higher quality layers and lower overall device thermal impedance as compared to silicon, sapphire, and SiC template approaches. A preferred embodiment is the formation of high quality high aluminum content AlGaN layers on freestanding nitride veneer 80 for use in active region 81. Also disclosed is the formation of dual sided devices in which drain 83 and source 82 are formed on opposite sides of active region 81. Alternately the formation of Gate 84 on the opposite side of active region 81 as either and/or both drain 83 and source 82 is an also an embodiment of this invention. The use of dual sided contacts in 3 Dimensional devices is a preferred embodiment. The use of dual sided contacts to reduce surface electron states between gate 84 and drain 83 and/or source 82 is also disclosed. The formation of at least one recessed gate 84 on either side of active region 81 is a preferred embodiment of this invention.

Figure 18:
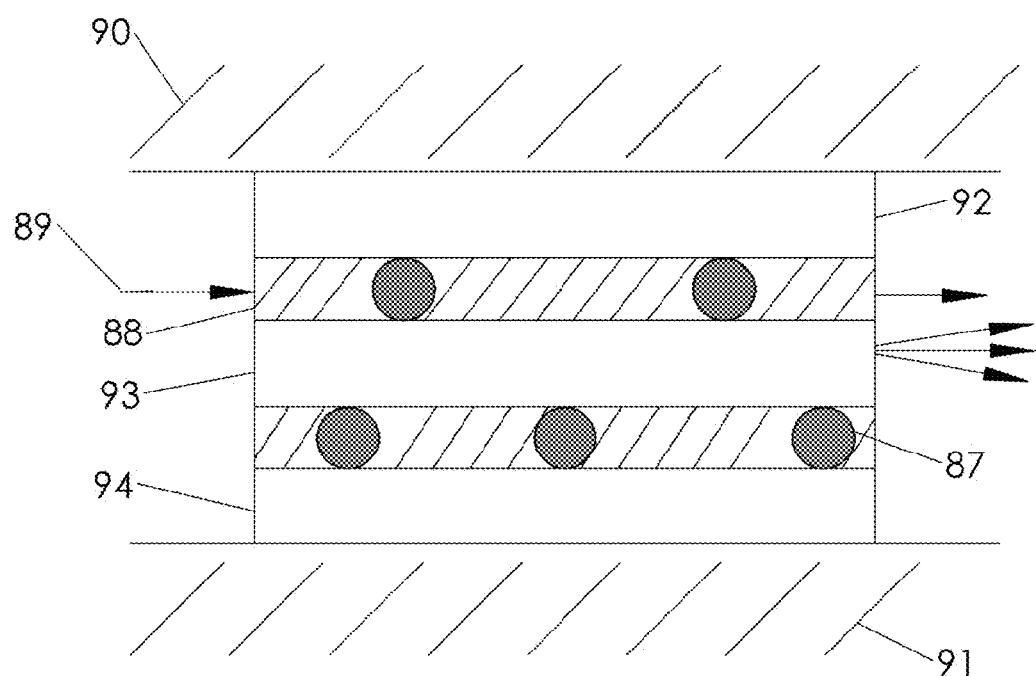
FIG. 18 depicts a 3 dimensional stack of nitride veneers.

FIG. 18 depicts a 3 dimensional stack of freestanding nitride veneer based devices 92, 93, and 94. Because the devices are all nitride both sides of the devices are available for contacts, heatsinking and device growth. Interconnects 87 may consist of but not limited to ball bumps, copper slugs, solder, phase change materials, as well as other interconnect means as known in the art. The devices maybe partially or fully bonded together via adhesive layer 88 which may consist of inorganic and/or organic bonding materials. Alternately, the space between the devices maybe used as a fluid pathway with an inlet flow and an exit flow 92. Heatsinks 90 and 91 can be used to thermally conduct heat out the 3 dimensional stack as well as provide a means of directing cooling fluids and/or gases into the device. The case where at least one of the freestanding nitride based devices 92, 93, and 94 contains at least one light emitting device 86 which may be used for irradiation, communication, sensing, and/or displays is a preferred embodiment of this invention.

Figure 19:
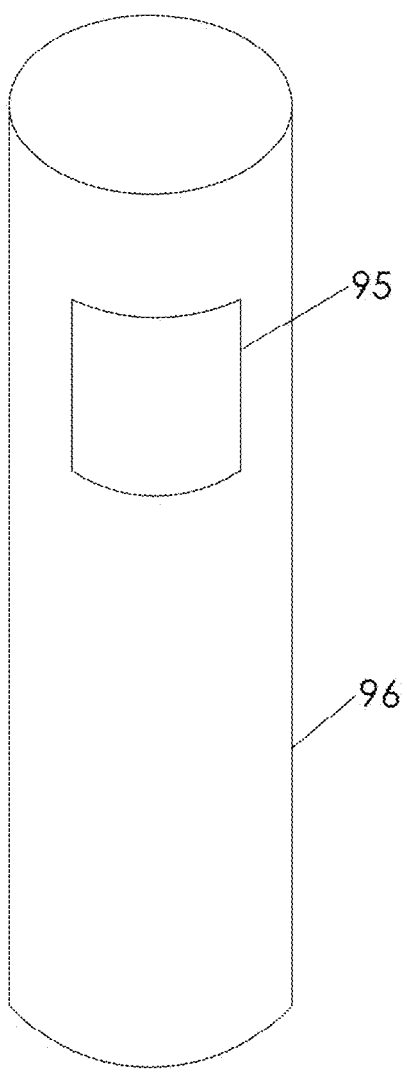
FIG. 19 depicts a flexible nitride veneer mounted to the outer surface of round heatpipe.

FIG. 19 depicts a heatpipe 96 to which a flexible freestanding device 95 is mounted. The ability to mount to a cylindrical surface not only reduces additional steps in forming the heatpipe but also allows the flexible freestanding device 95 to operate in a non flat manner. This may be advantageous for enhanced light extraction, reduced stresses, and/or better optical fixture design.

Figure 20:
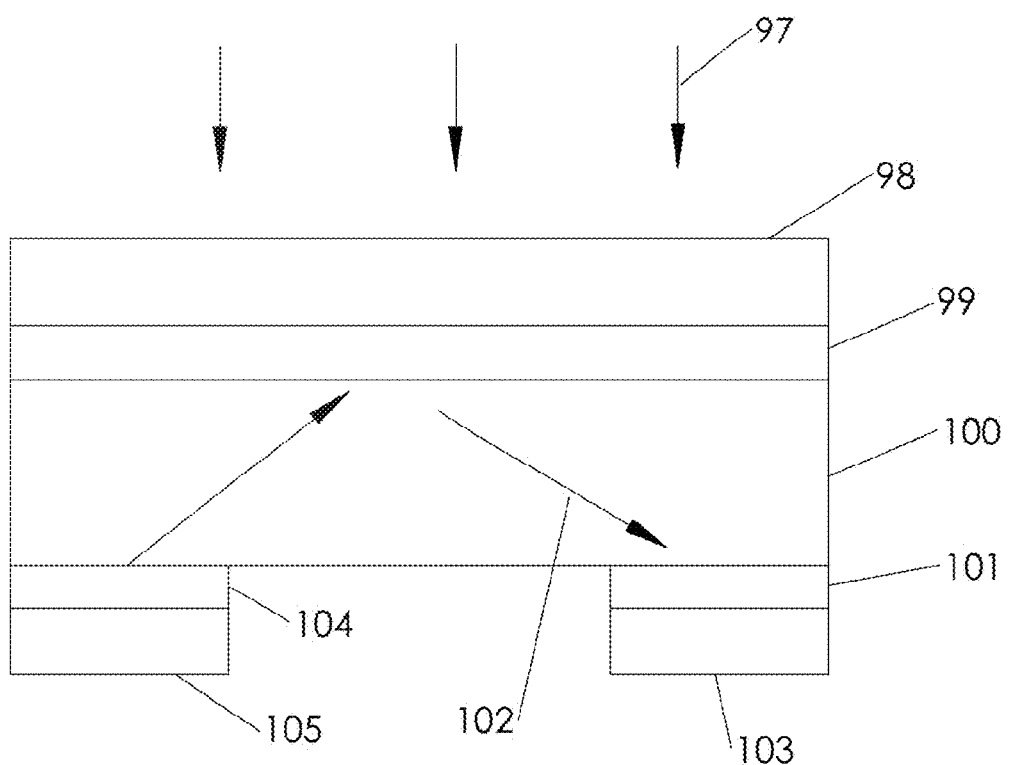
FIG. 20 depicts an integrated biosensor based on a freestanding nitride veneer.

FIG. 20 depicts a integrated biosensor based on a freestanding nitride veneer 100. The inherent transparency and ability to grow both emitters and detectors on a single layer enables the freestanding nitride veneer 100 to create a fully integrated biosensor. The biosensor detects optical changes in the bio-layer 98. Typically a index matching layer 99 is used to effectively couple light within the freestanding nitride veneer 100 into bio layer 98. Light generated by source 105 is coupled into the freestanding nitride veneer 100 via coupling layer 104. Coupling layer 104 can be used to restrict the angular, wavelength and/or polarization of the light rays 102 which enters the freestanding nitride veneer 100. In a similar manner coupling layer 101 can limit the angular, polarization, and/or wavelength with enters detector 103. In this manner the sensitivity of the device can be enhanced allowing for target molecules 97 can be detected by the bio layer 98.

While the invention has been described in conjunction with specific embodiments and examples, it is evident to those skilled in the art that many alternatives, modifications and variations will be apparent in light of the foregoing description. Accordingly, the invention is intended to embrace all such alternatives, modifications and variations as fall within the spirit and scope of the appended claims.

The invention claimed is:

1. A method for fabricating a flexible single crystal nitride veneer comprising:

harvesting a single crystal nitride layer grown on substrate by laser lift off;

wherein said single crystal nitride layer has a thickness between 20 and 150 μms; and using rapid thermal processing to deposit at least one semiconductor layer onto at least one side of said single crystal nitride layer.

2. The method of claim 1 wherein the single crystal nitride veneer growth substrate is flexed during growth of said at least one semiconductor layer to enhance the growth and/or physical properties of said semiconductor layer.

3. The method of claim 1 to fabricate a single crystal nitride veneer layer wherein said at least one semiconductor layer consists of at least one of the following materials: silicon, silicon/germanium, germanium, gallium arsenide, alingap, dilute nitrides, InP, antinomides, and ZnO alloys.

4. The method of claim 1 to fabricate a single crystal nitride veneer layer wherein using said rapid thermal processing to deposit said semiconductor layer on said single crystal nitride layer by using at least one of the following methods: sputtering, LPE, MBE, MOCVD, HVPE, ALD, evaporation, spraying, dip coating, printing, and/or spin coating.

5. The method of claim 1 to fabricate a single crystal nitride veneer layer wherein said semiconductor layer is a nitride solar cell junction.

6. The method of claim 1 to fabricate a single crystal nitride veneer layer wherein said method can form of at least one of the following devices: laser diode, HEMT, solid state pumped laser diode, solar cell, LED, or biosensor.

* * * * *